United States Patent [19]
Mueller et al.

[11] Patent Number: 5,163,141
[45] Date of Patent: Nov. 10, 1992

[54] RAM LOCK DEVICE AND METHOD FOR A TEXT ENTRY SYSTEM

[75] Inventors: David J. Mueller, Naperville; Denis B. Flynn, Glen Ellyn; Keith A. McCready, Chicago; Paul G. Dussault, Barrington, all of Ill.

[73] Assignee: Stenograph Corporation, Skokie, Ill.

[21] Appl. No.: 226,717

[22] Filed: Aug. 1, 1988

[51] Int. Cl.5 .................. G06F 12/14; G06F 12/16
[52] U.S. Cl. ................ 395/425; 364/DIG. 2; 364/928.6; 364/969; 364/969.2
[58] Field of Search .................. 395/725, 425; 364/200 MS File, 900 MS File

[56] References Cited

U.S. PATENT DOCUMENTS

| | | | |
|---|---|---|---|
| 3,971,916 | 7/1976 | Moreno | 364/200 |
| 4,245,308 | 1/1981 | Hirschman et al. | 364/200 |
| 4,388,695 | 6/1983 | Heinemann | 364/900 |
| 4,434,471 | 2/1984 | Hildinger | 364/900 |
| 4,435,766 | 3/1984 | Haber et al. | 364/200 |
| 4,439,380 | 12/1984 | Carey et al. | 364/200 |
| 4,472,790 | 9/1984 | Burk et al. | 364/900 |
| 4,493,031 | 1/1985 | Silverio | 364/200 |
| 4,587,609 | 5/1986 | Boudreau et al. | 364/200 |
| 4,740,890 | 4/1988 | William | 364/200 |
| 4,783,745 | 11/1988 | Brookner et al. | 364/900 |

*Primary Examiner*—Michael R. Fleming
*Assistant Examiner*—Debra A. Chun
*Attorney, Agent, or Firm*—Willian Brinks Olds Hoffer Gilson & Lione

[57] ABSTRACT

A memory system for use in a text entry system is provided. The system includes a retentive data memory and a system for locking a portion of the retentive memory and a key for unlocking the lockable portion of the memory to allow a predetermined number of bits of data to be written to the memory when the lockable memory is in unlocked state. The system automatically locks the memory after the predetermined number of bits have been written into the lockable portion of memory.

9 Claims, 4 Drawing Sheets

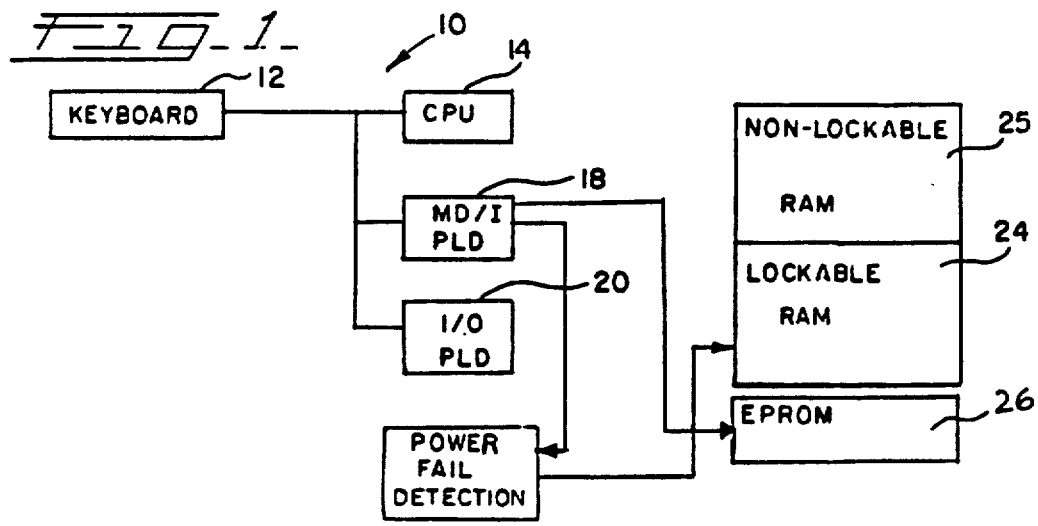
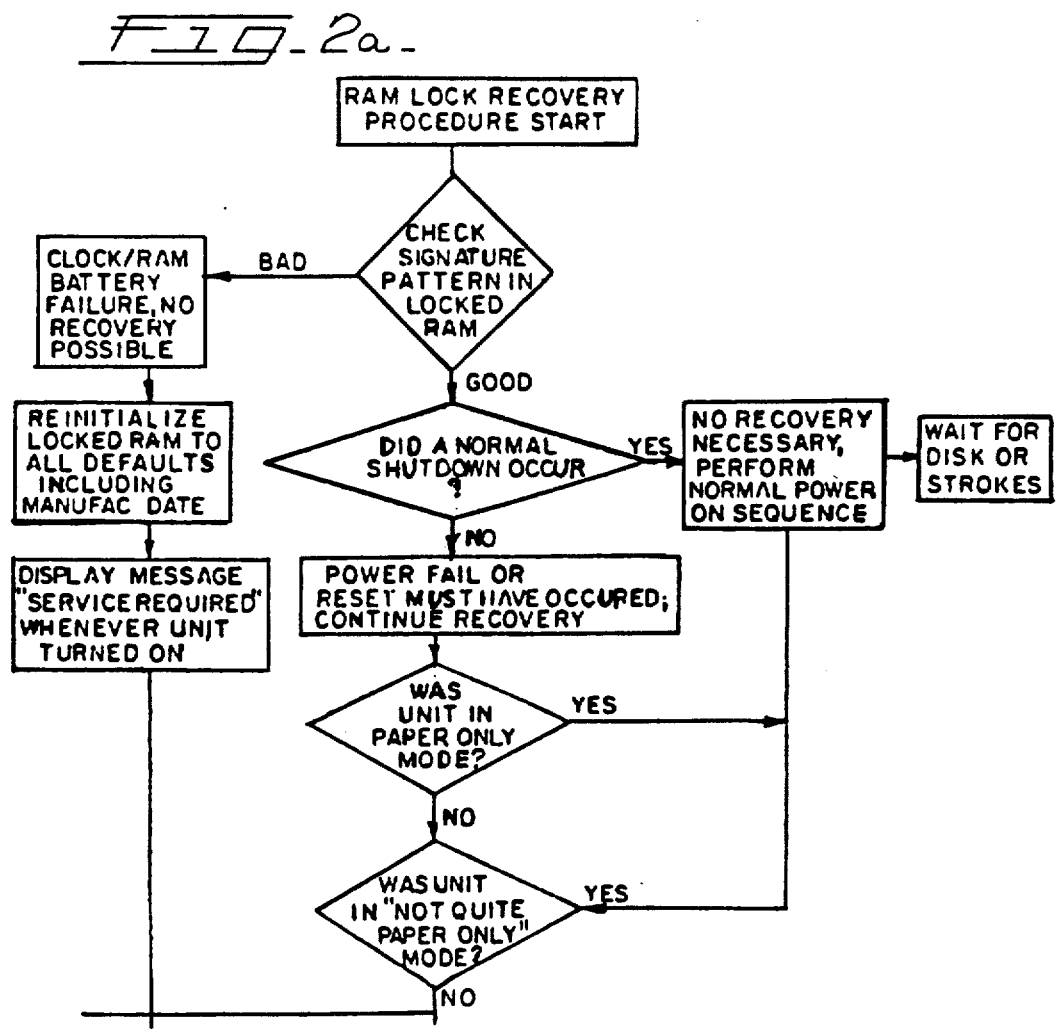

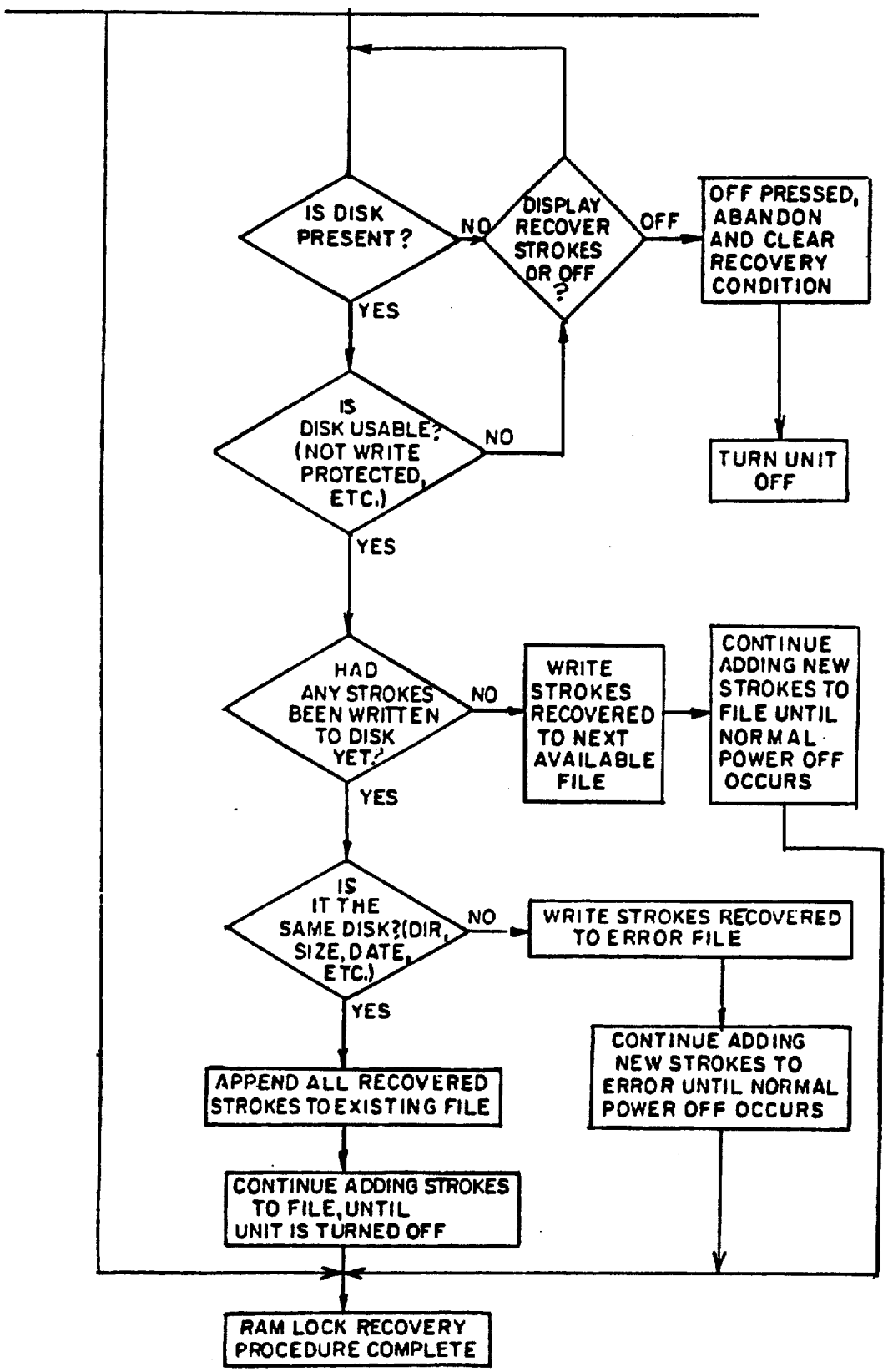
FIG_2b_

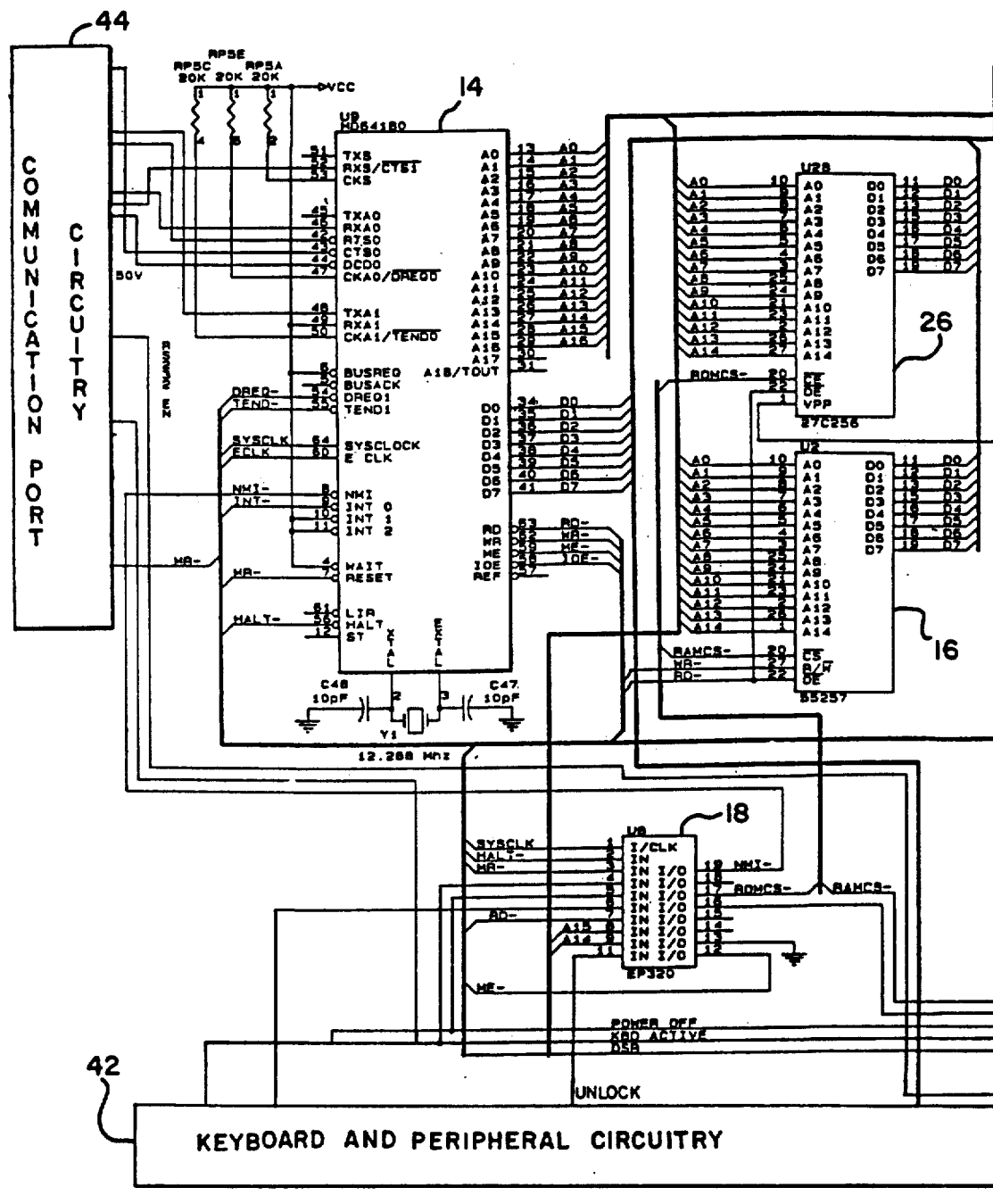
FIG_3A_

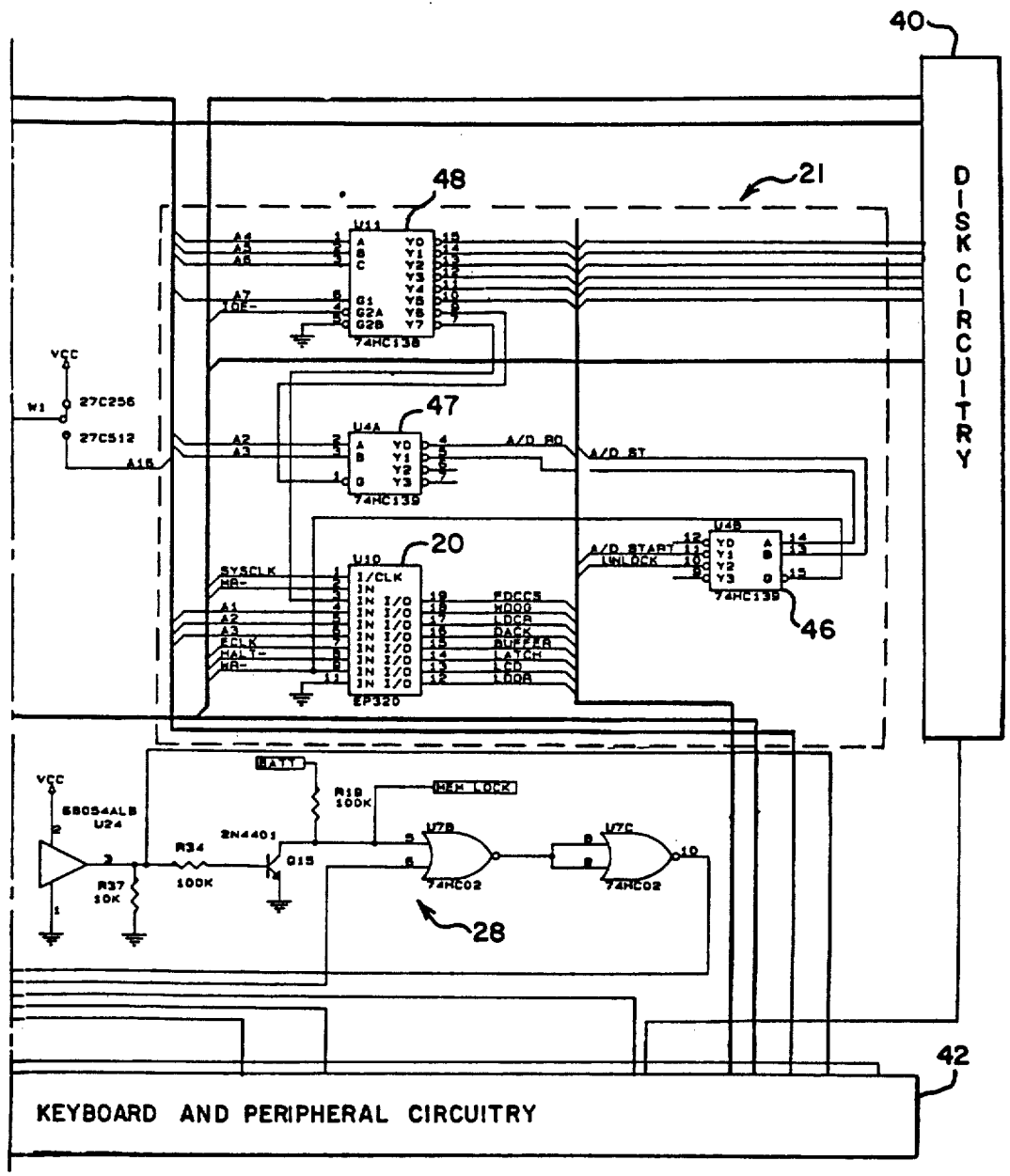

RAM LOCK DEVICE AND METHOD FOR A TEXT ENTRY SYSTEM

BACKGROUND OF THE INVENTION

This invention relates generally to a memory lock device and method and more particularly to a memory lock device and method for a text entry system.

Recent advances in memory systems for text entry systems such as those used in shorthand machines or other text editing machines have greatly enhanced the ability of the user to store data which is entered by means of a keyboard into a permanent storage device such as a floppy disk or a fixed disk.

Although existing memory systems provide the user with significant benefits they are not without disadvantages. For example one problem with existing memory devices is related to the ability of the memory to maintain the integrity of previously entered data in the event the system "crashes". Such system crashes may occur, for example, because of hardware failure, software malfunctions or more commonly if the power source such as the batteries in the device inadvertently fall out or are removed from the device.

Therefore, such devices typically include non-volatile or battery backed-up portions of memory into which the data associated with keystrokes from the keyboard is entered. In this manner if the text entry system suffers a loss of power, a non-volatile state of the memory will be maintained thereby preventing data from being lost if the system loses power.

An example of a device in which data is written to a non-volatile memory is given in U.S. Pat. No. 4,447,887 (Imazeki). This reference discloses a method and system for writing data in a non-volatile memory in which the writing of one access unit of stored data is executed by erase and write cycles such that the stored data is protected in the event of an interruption in electric power. In this system data is stored in a data storage area of a non-volatile memory and the data is rewritten into second data. Subsequently either the original or the second data is stored in a save area of the non-volatile memory after which the original data in the data storage area is erased. The second data is then written into the data storage area to complete the rewrite operation. In this manner, if a power interruption occurs before the information stored in the data storage area is taken out and preserved in a save area the information will remain in the storage area. On the other hand, if the power interruption occurs after the information stored in the data storage area has been taken out and preserved in the save area, but before the write cycle of the rewrite process has been completed, the information will remain in the save area. A restoration process may then be executed when the power is restored to restore the information in the save area to the data storage area.

An example of a system which incorporates a battery backed up memory is disclosed in U.S. Pat. No. 4,178,634 (Bartlett). This reference discloses a programmable logic controller which includes a scratch pad memory for the temporary storage of data which is divided into two sections. One of the memory sections is completely reset when the power is turned on while the other of the memory sections is maintained in its programmed state regardless of power failure. In the system disclosed in this reference the retentive portion of the scratch pad memory can only be reset by the actuation of a reset button when the power to the unit is turned "off".

These non-volatile or battery backed up memory systems, however, do not provide a complete solution to the occurrence of crashes in the system. For example, when a system crashes, data may be inadvertently written by the microprocessor to the memory locations which contain the pre-stored data from the keystrokes. In such an event the integrity of the data contained in the memory (which may correspond to the data entered from the keystrokes) would not be maintained.

It is therefore desirable to provide a system in which data which has been written into memory will remain intact even if the system crashes. It is desirable to assure not only that data will not automatically be erased if a crash occurs, but that data will not be altered when a crash or other system interrupts occurs.

Therefore in view of the above it is a primary object of the present invention to provide a system and method with which the integrity of data which has been previously written into a retentive type memory will be maintained.

It is a further objection of the present invention to provide a memory system for use in a text entry system which will prevent data which is not associated with a keystroke from being inadvertently entered into memory.

It is still the further object of the present invention to provide a lockable memory which will only allow predetermined data to be entered and prevent inadvertent alteration of previously entered data.

SUMMARY OF THE INVENTION

To achieve the foregoing in other objects and in accordance with the purposes of the present invention, a lockable memory system is provided which includes a retentive data memory and means for locking a portion of the retentive data memory to define a lockable portion of the memory. The memory lock means prevents data from being written to the lockable portion of memory when the lockable portion of memory is in a locked state. The system further includes memory key means for unlocking the lockable portion of the memory and allow only a predetermined number of bits of data to be written to the lockable portion of memory when the memory is in an unlocked state. Means are provided for automatically returning the lockable portion of memory to the locked state after the predetermined number of bits of data have been written to the lockable portion of memory. Means are also provided for writing the predetermined number of bits of data to the lockable portion of the memory when the memory key means is actuated.

With this arrangement only a predetermined number of bits of data may be written to the lockable portion of memory upon actuation of the memory key means. After the predetermined number of bits of data have been written, the system automatically returns to a locked state thereby preventing any further data from being written to the lockable portion of memory.

In a preferred embodiment a single byte of data is allowed to be written to the lockable portion of memory after the memory key means has been actuated. In this manner only a single byte of data may be lost if the system crashes.

The invention further contemplates a method for entering data into a retentive data memory for a text entry system. The method includes generating data associated with a keystroke from the keyboard, locking a portion of the retentive data memory such that data cannot be written to the lockable portion of memory without a memory key code. If it is determined that the data to be written to the lockable portion of memory is data associated with a keystroke, a memory key code signal is generated which unlocks the lockable portion of memory. After the lockable portion of memory has been unlocked, a predetermined number of bits of data associated with the keystroke are written into the lockable portion of memory while the memory is in an unlocked state. After the predetermined number of bits of keystroke data have been written to the lockable portion of memory, the lockable portion of memory is again locked, thereby preventing further data from being written thereto.

In a preferred embodiment the data corresponding to a single keystroke is divided into a number of segments. Each segment is written to the lockable portion of memory separate from the other segments. Thus, the memory is unlocked and a single segment of data corresponding to the keystroke is written to the lockable portion of memory. After the single segment is written, the lockable portion of memory is again relocked. In this manner only, a segment of keystroke data is lost if the system crashes.

The foregoing objects, advantages and novel features of the invention as well as others will become apparent to those skilled in the art upon examination of the following detailed description of a presently preferred embodiment of the present invention in conjunction with the appended drawings. The objects and advantages of the invention may be obtained by means of the instrumentalities and combinations particularly pointed out in the appended claims.

BRIEF DESCRIPTION OF THE DRAWINGS

FIG. 1 is a schematic, in block diagram form, of a preferred embodiment of the lockable memory system of the present invention.

FIGS. 2a and 2b illustrate a preferred algorithm for data recovery.

FIGS. 3A and 3B are an electrical schematic diagram illustrating a preferred embodiment of the memory system illustrated in FIG. 1.

DETAILED DESCRIPTION OF THE PRESENTLY PREFERRED EMBODIMENTS

Referring now to the drawings and specifically to FIGS. 1 and 3 a text entry system, denoted generally by reference numeral 10, includes a keyboard 12 a microprocessor or CPU 14, a memory system, denoted generally by reference numeral 16 and means described in more detail below to lock a portion of the memory 16 such that no data may be written to the locked portion of memory 16 when in a locked state and a limited amount of data may be written to the locked portion of memory 16 when in an unlocked state.

In a preferred embodiment, illustrated generally in FIG. 1 and illustrated in more detail in FIG. 3, the memory system 16 includes two programmable logic devices (PLDs) 18 and 20 and decoders or multiplexers 46, 47 and 48 which are used to decode chip selects for the I/O and memory. The PLDs are advantageously used in a manner described below to divide the system's 10 random access memory (RAM) 16 into a lockable portion 24 and a non-lockable portion 25. For example the system memory may be divided to include 16K of RAM (non-lockable) in addresses C000-FFFF and 16K of lockable RAM in addresses 8000-C000. The memory or RAM 16 is preferably a retentive type of memory. Retentive is defined here as a memory system which will retain stored data in the event of a power failure to the text entry system. For example, the retentive memory may comprise a non-volatile type of memory or a battery backed-up memory. Preferably, the RAM 16 is a CMOS type chip and the system includes separate batteries for the CMOS chip to keep the RAM 16 non-volatile. A suitable RAM is available from several sources, for example, Fujitsu.

The system 10 preferably also includes a read only memory (ROM) chip and more preferably an erasable programmable read only memory (EPROM) 26. The EPROM 26 may be used to store the system's 10 program code which is executed by the CPU 14. A suitable CPU 14 is available from Hitachi as Model No. 64180 and a suitable EPROM is available from several sources, for example, Intel.

In the presently preferred embodiment the memory decoder PLD 18 is used to decode the chip select (ROMCS) for the EPROM 26 and the chip select (RAMCS) for the RAM 16 to provide the desired RAM lock system. The memory decoder PLD 18 is preferably programmed such that a state machine is created. In a first state the memory enable line (17) from the memory decoder PLD 18 enables the CPU 14 to read to or write from the nonlockable portion 25 of RAM 16. If there is a request to read or write to the lockable portion 24 of RAM 16 the system goes into a next state. In this state, if the request is to read data from the lockable portion 24 of RAM 16, the PLD 18 will activate the chip select for the RAM 16 enabling the CPU 14 to read from the lockable portion 24 of RAM 16. However, if the request is to write to the lockable portion 24 of RAM 16, the PLD 18 will only activate or pass the RAMCS if a predetermined condition is met. If the condition is met the PLD 18 will enable the CPU 14 to write only a predetermined number of bits to the lockable portion 24 of RAM. Thus, this predetermined condition provides a memory key to unlock the lockable portion 24 of RAM 16. After the predetermined number of bits have been written to the lockable portion 24 of RAM 16, the PLD 18 will automatically return to a locked stated. If the predetermined condition is not met the PLD 18 will not activate the RAMCS, thus preventing data from being written to the RAM 16. Preferably the PLD 18 enables the CPU 14 to write one byte of data to the lockable portion 24 of RAM 16 after it has been unlocked.

In a preferred embodiment the PLD 18 is programmed such that in order to write to the lockable portion 24 of 16, the microprocessor or CPU 14 must write to a predetermined I/O address, for example I/O address E4. By writing to the E4 address, the lockable portion of memory 24 is unlocked. Thus writing to I/O address E4 provides a memory key to unlock the lockable portion 24 of RAM 16.

In the exemplary embodiment illustrated in FIG. 3, PLD 20, two 2 to 4 decoders 46 and 47, and a 3 to 8 decoder 48 define as an I/O decoding device 21 in a manner completely within the skill of the artisan in this area and thus no further details of the implementation are given here. The I/O decoding device 21 decodes the I/O address being written to and generates a pulse to indicate that I/O address E4 has been written to. The pulse is transmitted to the PLD 18 indicating that an unlock is allowed thereby providing a key code signal to unlock the lockable RAM portion 24.

Preferably, when the lockable portion 24 of RAM 16 is unlocked, only one write operation can be performed to the lockable portion 24 of RAM 16. After the one write operation is performed, the RAM 16 is relocked and cannot be written to until it is again unlocked. In the preferred embodiment, the PLD 18 is programmed such that the lockable portion 24 of RAM 16 as well as the rest of the RAM 16 may be read from at any time without effecting the locked or unlocked state of the lockable RAM 16. Further, the nonlockable portion 25 of RAM 16 may be written to at any time without effecting the locked or unlocked state of the lockable portion 24 of RAM 16.

Suitable PLD devices for the I/O decoding PLD 20 and the memory decoding PLD 18 are available from Intel as Model No. 5C032 and suitable software for the memory decoder PLD 18 is given in Table 1 for use with the above listed PLD.

the RAM 16, preparing it for the write to be made. Line 3 writes the value "7" from the "A" register of the CPU 14 into address 8000 of the lockable portion 24 of the RAM 16. After this write is performed, the lockable portion 24 becomes once again locked. Following this example, in line 4 when an attempt is made to write to lockable portion 24, the attempt will fail.

| 1: | ld | a,07h | ;want to write 7 to<br>; lockable RAM |
|---|---|---|---|
| 2: | outO | (0e4H) ,a | ;unlock RAM<br>; I/O address E4 is written<br>; to in order to UNLOCK<br>; lockable RAM |
| 3: | ld | (08000h) ,a | ;this write to lockable RAM<br>; is successful |
| 4: | ld | (08001h) ,a | ;this write to lockable RAM<br>; is unsuccessful |

If the contents of addresses 8000H and 8001H were as follows before the above code segment was executed:

TABLE 1

```
OPTIONS        : TURBO = ON
PART           : SC032
INPUTS         : P1 ©1, P5 ©2, P3 ©3, P4 ©4, P5 ©5, P6 ©6, P7 ©7, P8 ©8, P9 ©9, P11 ©11,
                 P12 ©12
OUTPUTS        : Q19 ©19, Q18 ©18, Q17 ©17, Q16 ©16, Q15 ©15, Q14 ©14
NETWORK        :
                 % MEMORY %
P1 = INP(P1)     % CLOCK %
P2 = INP(P2)     % /HALT %
P3 = INP(P3)     % /RESET %
P4 = INP(P4)     % /KBD %
P5 = INP(P5)     % POWER OFF %
P6 = INP(P6)     % WATCH DOG %
P7 = INP(P7)     % /RD %
P8 = INP(P8)     % A15 %
P9 = INP(P9)     % A14 %
P11 = INP(P11)   % UNLOCK %
P12 = INP(P12)   % /ME %
Q19,Q19 = COIF(Q19C,) % /NMI %
Q18,Q18 = RORF(Q18D, P1,,,) % /WAIT %
Q17,Q17 = COIF(Q17C,) % /ROMCS %
Q16,Q16 = COIF(Q16C,) % /RAMCS %
Q15,Q15 = RORF(Q15D,P1,,,) % LOCK1 %
Q14,Q14 = RORF(Q14d,P1,,,) % LOCK2 %
EQUATIONS :
%/NMI = /KBD*/HALT ®WATCH DOG ®POWER OFF*/HALT%
Q19C' = /P4 * /P2 ® P6 ® P5 * /P2;
%/WAIT = VCC%
Q18D' = VCC;
%/ROMCS = /A15*/ME%
Q17C' = /P8 * /P12;
%RAMCS = A15*A14*/ME ®A15*/A14*/ME*(LOCK1 ® LOCK2) ®A15*/A14*/ME*/RD%
Q16C' = P8 * P9 * /P12 ® P8 * /P9 * /P12 * (Q15 ® Q14) ® P8 * /P9 * /P12 * /P7;
%LOCK1 = RESET*A15*/A14*RD*/ME*(LOCK1 ®LOCK2)%
Q15D = P3 * P8 * /P9 * P7 * /P12 * (Q15 ® Q14);
%LOCK2 = RESET*(/UNLOCK ®/LOCK1*LOCK2 ®/RAMCS*/A14*RD*(LOCK1 ®LOCK2))%
Q14D = P3 * (/P11 ® (/Q15 * Q14) ® (/Q16 * /P9 * P7 * (Q15 ® Q14)));
END
```

Thus, in this exemplary embodiment the unlocking of the lockable portion 24 RAM 16 is implemented by a software program in a two step process. First, the processor 14 is commanded to write to a predetermined I/O address, for example I/O address E4. This write command unlocks the lockable portion 24 of RAM 16. Subsequently, the data is written to the desired location in the lockable memory portion 24.

For purposes of example, a code section written in 64180 assembly language which may be used to implement the locking and writing steps to the lockable section 24 is given below. In this example, in line 1 the data to be written (the value "7") is stored in the "A" register of CPU 14. In line 2, a write is made to address E4. This write command unlocks the lockable portion 24 of

8000H - 00
8001H - 00

After the code was executed, they would have contents as follows:

8000H - 07
8001H - 00

Preferably other instructions may also be used to write values to the lockable portion 24 of RAM 16. However, the procedure for unlocking the lockable portion 24 by writing to the I/O address E4 before writing to the lockable portion 24 is the only manner in which values may be stored in the lockable portion 24.

In a preferred embodiment, the RAM 16 includes 32K of RAM and is split into two halves, 16K of lockable RAM and 16K of normal nonlockable RAM.

The lockable portion 24 of RAM 16 preferably includes two keystroke buffers which are used to store a predetermined number of strokes. In an exemplary embodiment each buffer may contain enough memory space for 512 strokes and may be used to store data before it is written to a disk. In a preferred embodiment data is written to the first buffer until the buffer is full. When the first buffer is full data is stored in the second buffer and the data from the first buffer is written to the disk.

The lockable portion 24 of RAM 16 may include other data such as a RAM signature pattern which when destroyed signals that power to the RAM was lost and that no data may be recovered from the locked portion 24 of RAM 16. The lockable portion 24 may further include a current stroke buffer, current buffer number, current buffer pointers and flags, and data to indicate that the system 10 has lost power and a recovery process is necessary.

The non-lockable portion 25 of RAM 16 may include, for example, communication buffers and work space, flags, pointers, scratch pad RAM, and a buffer for reading from disk.

As best illustrated in FIG. 1, the preferred embodiment also includes a power failure detection circuit 28 which detects when the system 10 has lost power and inactives the chip selects for the RAM 16. The power failure detection circuit 28 prevents data from being inadvertently written to the RAM 16 when the system 10 loses power or when the power falls below a predetermined level.

As illustrated in FIG. 3, the memory system may be operably connected to other system circuitry such as circuitry for the keyboard and other peripheral system circuitry which is illustrated in block form and designated by reference numeral 42. The peripheral system circuitry may include, for example, circuitry for a display, a beeper, a motor drive, and circuitry for A/D conversion for user spacing. The memory system may also be operatively connected to disk drive circuitry such as circuitry for a floppy disk drive which is illustrated in block form and designated by reference numeral 40. The memory system may further include circuitry for a communication port, such as a serial port, which circuitry is illustrated in block form and designated by reference numeral 44.

The text entry system 10 also preferably includes means for recovering data from the lockable portion 24 of RAM 16. Such a recovery system is preferably implemented by means of suitable software. A suitable algorithm for such a recovery process is given in FIGS. 2a and 2b.

As discussed above the system preferably includes flags in the locked portion 24 of the RAM 16 which signal when an abnormal termination has occurred. In this manner if it is determined that the system did not power down normally a recovery process such as illustrated in FIGS. 2a and 2b may be implemented to recover the data from the lockable portion 24 of RAM 16.

In one preferred embodiment the text entry system is a shorthand processing machine wherein each keystroke typically include three bytes of data. The three bytes of each single keystroke are first received from the keyboard 12 and placed in a current stroke buffer in the locked portion 24 of RAM 16 in the manner described above. In this manner each keystroke is saved immediately after it is entered. When the keys are released and debounced, the three byte stroke is preferably expanded to a four byte format and stored in a keystroke buffer in the lockable portion 24 of RAM 16. When the first buffer is full, it is written directly to a permanent storage disk such as a floppy disk. Simultaneously, the data from any additional keystrokes are saved in the other keystroke buffer.

With this preferred arrangement in the event of abnormal termination of the text editing device operation, the keystrokes will remain saved in the locked portion 24 of memory 16. As discussed above, such abnormal terminations are possible in events such as when the batteries inadvertently fall out or are removed from the machine or when the battery level falls below a predetermined safe level.

Since the PLD 18 preferably only allows a single byte of data to be written to the lockable portion 24 of RAM 16, the system of the present invention assures that even if the shorthand processing machine crashes, the data in the keystroke buffers will at most suffer the loss of one byte (or ¼ of a stroke).

The present invention provides a system which prevents the processor 14 from writing to lockable RAM portion 24 unless the processor is functioning normally and is using the correct procedure to write to the lockable RAM portion 24. With such an arrangement, the only way to unlock lockable RAM portion 24 is to write to the I/O address E4. Further, the only way to lock the lockable RAM portion is to write to the lockable RAM portion. This method of locking and unlocking RAM 16 maintains the integrity of the data in the lockable RAM portion in the case of interrupts which occur between the time the lockable RAM portion 24 was unlocked and the actual write to the lockable RAM portion 24. Interrupts, which do not use lockable RAM portion 24, may then freely write to nonlockable RAM portion 25 while leaving lockable RAM portion 24 unlocked. Upon return from the interrupt, the write to the lockable RAM portion 24 may then be performed and the lockable RAM portion 24 will once again be locked. If the system "locks up" or the batteries for the system fall out or for some other reason the system "crashes", the system may be reset or the batteries reinstalled and the power turned on, the recovery process for the data will preferably automatically begin. The keystrokes kept in the locked RAM portion 24 will be written to the disk and the user may continue from the point of the interruption without the loss of data or keystrokes.

The foregoing description of the preferred embodiments of the present invention has been presented for purposes of illustration and description. It is not intended to limit the scope of the invention, which is defined by the appended claims and their equivalents. Various modifications and variations of the preferred embodiments are possible in light of the above teaching and will be apparent to persons skilled in the art. Such modifications and variations do not depart from the spirit or scope of the invention and it is therefore intended that the scope of the invention be defined by the following claims, including all equivalents.

We claim:

1. A lockable memory system for use in a text entry system including a keyboard, said memory system comprising:
   a retentive data memory;

lock means for locking a portion of said retentive memory to define a lockable portion of said memory, said lock means preventing data from being written to said lockable portion of said memory when said lockable portion of said memory is in a locked state, said lock means automatically placing said lockable portion of memory initially in said locked state;

unlock means for unlocking said lockable portion of said memory to allow a predetermined number of bits of data to be written thereto when said lockable portion of said memory is in unlocked state;

means for automatically actuating said lock means as soon as said predetermined number of bits of data have been written to said lockable portion of said memory;

means responsive to a keystroke from said keyboard for actuating said unlock means;

means for writing data associated with said keystroke to said lockable portion of said memory upon actuation of said unlock means;

wherein said lock means, said unlock means and said means for automatically actuating said lock means comprises at least one preprogrammed logic device; and a power failure detection means for locking said lockable portion of memory upon detection of loss of power to the system.

2. A method of entering keystroke data from a keyboard of a text entry system in a retentive text entry system memory, said method comprising the steps of:

generating data associated with a keystroke from said keyboard;

initially locking a portion of a retentive data memory such that no data can be written to said data memory without an unlock code, thereby defining a lockable portion of memory;

determining whether data to be written to said memory is keystroke data;

if said data is keystroke data, generating an unlock code signal;

unlocking said lockable portion of said memory in response to said unlock code signal such that an unlocked state of said lockable memory is defined;

writing a predetermined number of bits of said keystroke data into said lockable portion of memory while said lockable portion of memory is in said unlocked state;

automatically locking said lockable portion of memory as soon as said predetermined number of bits have been written into said lockable portion of memory; and recovering said data from said lockable portion of memory after the occurrence of a crash in said text entry systems.

3. A method of entering keystroke data from a keyboard of a text entry system in a retentive entry system memory, said method comprising the steps of:

generating data associated with a keystroke from said keyboard;

initially locking a portion of a retentive data memory such that no data can be written to said data memory without an unlock code, thereby defining a lockable portion of memory;

determining whether data to be written to said memory is keystroke data;

if said data is keystroke data, generating an unlock code signal;

unlocking said lockable portion of said memory in response to said unlock code signal such that an unlocked state of said lockable memory is defined;

writing a predetermined number of bits of said keystroke data into said lockable portion of memory while said lockable portion of memory is in said unlocked state; and automatically locking said lockable portion of memory as soon as said predetermined number of bits have been written into said lockable portion of memory; and dividing said data associated with said keystrokes into a plurality of segments, each segment having a predetermined number of segment bits and wherein the step of writing a predetermined number of bits of data into said lockable portion of memory comprises writing said segment bits into said lockable portion of memory.

4. A lockable memory system comprising:

a retentive data memory;

lock means for locking a portion of said retentive memory to define a lockable portion of said memory, said lock means preventing data from being written to said lockable portion of said memory when said lockable portion of said memory is in a locked state, said lock means automatically placing said lockable portion of memory initially in said locked state;

unlock means for unlocking said unlockable portion of said memory to allow a predetermined number of bits of data to be written thereto when said lockable portion of said memory is in said unlocked state;

means for actuating said unlock means;

means for automatically actuating said lock means as soon as said predetermined number of bits of data have been written to said lockable portion of said memory; and means for writing a predetermined number of bits of data to said lockable portion of said memory upon actuation of said unlock means;

means for recovering data from said lockable portion of memory;

power failure detection means for locking said lockable portion of memory upon detection of loss of power to the system;

wherein said lock means, said key means and said means for automatically actuating said lock means comprises at least one preprogrammed programmable logic device; and wherein said programmable logic device unlocks said lockable portion of said memory when a predetermined memory address of said memory is written to.

5. A lockable memory system for use in a text entry system including a keyboard, said memory system comprising:

a retentive data memory;

a lock means which receives all control signals, including those generated from keyboards from said keyboard, said signals being generated in said text entry system;

said lock means produces a locking signal for locking a portion of said retentive memory to define a lockable portion of said memory when said lockable portion of said memory is in a locked state, said lock means automatically placing said lockable portion of memory initially in said locked state;

unlock means for unlocking said lockable portion of said memory to allow a predetermined number of bits of data to be written thereto when said lockable portion of said memory is in unlocked state, wherein said unlock means is enabled only upon received a signal from a keystroke received at said lock means;

means for automatically actuating said lock means as soon as said predetermined number of bits of data have been written to said lockable portion of said memory;

means responsive to a keystroke from said keyboard for actuating said unlock means; and means for writing data associated with said keystroke to said lockable portion of said memory upon actuating of said unlock means.

6. A lockable memory system for use in a text entry system including a keyboard, said memory system comprising:

a retentive data memory comprising a first storage area and a second storage area;

lock means for producing a locking signal for locking said first storage area of said retentive memory to define a lockable portion of said memory, said lock means preventing data from being written to said lockable portion of said memory when said lockable portion of said memory is in a locked state, said lock means automatically placing said lockable portion of memory initially in said locked state, wherein said second storage area remains unlocked when the locking signal is received by the second storage area;

unlock means for unlocking said lockable portion of said memory to allow a predetermined number of bits of data to be written thereto when said lockable portion of said memory is in the unlocked state;

means for automatically actuating said locking means as soon as said predetermined number of bits of data have been written to said lockable portion of said memory, wherein said lock means, said unlock means and said means for automatically actuating said lock means comprises at least one preprogrammed programmable logic device which unlocks said lockable portion of said memory when a predetermined memory address of said memory is written to;

power failure detection means for locking said lockable portion of memory upon detection of loss of power to the system;

means responsive to a keystroke from said keyboard for actuating said unlock means; and means for writing data associated with said keystroke to said lockable portion of said memory upon actuation of said unlock means.

7. A method of entering keystroke data from a keyboard of a text entry system in a retentive text entry system memory, said memory comprising a first storage area unlockable only upon receiving an unlock code signal, and said memory comprising a second non-lockable storage area of said retentive text entry system memory which is in an unlocked state irrespective of whether the first storage area is locked or unlocked, said method comprising the steps of:

generating data associated with a keystroke from said keyboard;

initially locking said first storage area of the retentive data memory such that no data can be written to said data memory without an unlock code signal, thereby defining a lockable portion of memory;

determining whether data to be written to said memory is keystroke data;

if said data is keystroke data, generating an unlock code signal;

unlocking said lockable portion of said memory in response to said unlock code signal such that an unlocked state of said lockable portion of memory is defined;

writing a predetermined number of bits of said keystroke data into said lockable portion of memory while said lockable portion of memory is in said unlocked state;

automatically locking said lockable portion of memory as soon as said predetermined number of bits have been written into said lockable portion of memory, while keeping the second non-lockable storage area of memory unlocked; and recovering said data from said lockable portion of memory after the occurrence of a crash in said text entry system.

8. A method of entering keystroke data from a keyboard of a text entry system in a retentive text entry system memory, said memory comprising a first storage area unlockable only upon receiving an unlock code signal, and said memory comprising a second non-lockable storage area of said retentive text entry system memory which is in an unlocked state irrespective of whether the first storage area is locked or unlocked, said method comprising the steps of:

generating data associated with a keystroke from said keyboard;

initially locking said first storage area of the retentive data memory such that no data can be written to said data memory without an unlock code signal, thereby defining a lockable portion of memory;

determining whether data to be written to said memory is keystroke data;

if said data is keystroke data, generating an unlock code signal;

unlocking said lockable portion of said memory in response to said unlock code signal such that an unlocked state of said lockable portion of memory is defined;

writing a predetermined number of bits of said keystroke data into said lockable portion of memory while said lockable portion of memory is in said unlocked state;

automatically locking said lockable portion of memory as soon as said predetermined number of bits have been written into said lockable portion of memory, while keeping the second non-lockable storage area of memory unlocked; and dividing said data associated with said keystrokes into a plurality of segments, each segment having a predetermined number of segment bits and wherein the step of writing a predetermined number of bits of data into said lockable portion of memory comprises writing said segment bits into said lockable portion of memory.

9. A lockable memory system comprising:

a retentive data memory comprising a first storage area and a second storage area;

lock means for producing a locking signal for locking said first storage area of said retentive memory to define a lockable portion of said memory, said lock means preventing data from being written to said lockable portion of said memory when said lockable portion of said memory is in a locked state, said lock means automatically placing said lockable portion of memory initially in said locked state; wherein said second storage area has a structure such that when the locking signal is received by the second storage area, wherein the second storage area is not locked;

unlock means for unlocking said lockable portion of said memory to allow a predetermined number of bits of data to be written thereto when said lockable portion of said memory is in said unlocked state, wherein said lock means, said unlock means and said means for automatically actuating said lock means comprises at least one preprogrammed programmable logic device which unlocks said lockable portion of said memory when a predetermined memory address of said memory is written to;

power failure detection means for locking said lockable portion of memory upon detection of loss of power to the system;

means for actuating said unlock means;

means for automatically actuating said lock means as soon as said predetermined number of bits of data have been written to said lockable portion of said memory;

means for writing a predetermined number of bits of data to said lockable portion of said memory upon actuation of said unlock means; and means for recovering data from said lockable portion of memory.

* * * * *

UNITED STATES PATENT AND TRADEMARK OFFICE
CERTIFICATE OF CORRECTION

PATENT NO. : 5,163,141

DATED : November 10, 1992

INVENTOR(S) : David J. Mueller et al.

It is certified that error appears in the above-indentified patent and that said Letters Patent is hereby corrected as shown below:

On title page, item [56]

Under the heading "U.S. PATENT DOCUMENTS", in Column 2, the first line, please delete "4,439,380" and substitute therefor --4,489,380--.

Under the heading "Attorney, Agent, or Firm", please delete "Hoffer" and substitute therefor --Hofer--.

Column 2, line 17, please delete "interrupts" and substitute therefor --interrupt--.

Column 2, line 23, please delete "objection" and substitute therefor --object--.

Column 2, line 44, please delete "allow" and substitute therefor --allows--.

Column 3, line 50, please delete "3" and substitute therefor --3A and 3B--.

Column 3, line 51, after "12" please insert --,--.

UNITED STATES PATENT AND TRADEMARK OFFICE
CERTIFICATE OF CORRECTION

PATENT NO. : 5,163,141
DATED : November 10, 1992
INVENTOR(S) : David J. Mueller et al.

It is certified that error appears in the above-indentified patent and that said Letters Patent is hereby corrected as shown below:

Column 3, line 60, please delete "FIG. 3" and substitute therefor --FIGS. 3A and 3B--.

Column 4, line 11, please delete "volative" and substitute therefor --volatile--.

Column 4, line 46, please delete "stated" and substitute therefor --state--.

Column 4, line 60, please delete "FIG. 3" and substitute therefor --FIGS. 3A and 3B--.

Column 5, in Table 1, in the third line across from "INPUTS", please delete "PS©2" and substitute therefor --P2©2--.

Column 5, in Table 1, in line 32, please delete "%RAMCS" and substitute therefor --%/RAMCS--.

Column 7, line 30, please delete "inactives" and substitute therefor --inactivates--.

Column 7, line 65, please delete "include" and substitute therefor --includes--.

UNITED STATES PATENT AND TRADEMARK OFFICE
CERTIFICATE OF CORRECTION

PATENT NO. : 5,163,141

DATED : November 10, 1992

INVENTOR(S) : David J. Mueller et al.

It is certified that error appears in the above-indentified patent and that said Letters Patent is hereby corrected as shown below:

Column 10,

Claim 4, line 11, please delete "unlockable" and substitute therefor --lockable--.

Claim 5, line 6, please delete "keyboards" and substitute therefor --keystrokes--.

Col. 11, claim 6, line 22, delete "locking" and substitute therefor --lock--.

Signed and Sealed this

Twenty-sixth Day of July, 1994

Attest:

BRUCE LEHMAN

Attesting Officer     Commissioner of Patents and Trademarks